(12) United States Patent
Oshima et al.

(10) Patent No.: US 6,490,700 B1
(45) Date of Patent: Dec. 3, 2002

(54) MEMORY DEVICE TESTING APPARATUS AND DATA SELECTION CIRCUIT

(75) Inventors: Hiromi Oshima, Tokyo (JP); Koichi Adachi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/310,173

(22) Filed: May 12, 1999

(30) Foreign Application Priority Data

May 13, 1998 (JP) .......................................... 10-130060
May 18, 1998 (JP) .......................................... 10-151881

(51) Int. Cl.[7] .............................................. G11C 29/00
(52) U.S. Cl. ...................... 714/718; 714/719; 714/720
(58) Field of Search ................................ 714/718, 719, 714/720, 721, 724, 738, 33

(56) References Cited

U.S. PATENT DOCUMENTS

| | | | |
|---|---|---|---|
| 5,062,109 A | * 10/1991 | Oshima et al. ............. 714/719 |
| 5,216,673 A | * 6/1993 | Kanai .......................... 714/719 |
| 5,432,797 A | * 7/1995 | Takano ........................ 714/718 |
| 5,781,718 A | * 7/1998 | Nguyen ........................ 714/33 |
| 5,889,786 A | * 3/1999 | Shimogama ................. 714/720 |
| 6,219,806 B1 | * 4/2001 | Ogiwara ...................... 714/718 |

* cited by examiner

Primary Examiner—Emmanuel L. Moise
(74) Attorney, Agent, or Firm—Rosenthal & Osha L.L.P.

(57) ABSTRACT

A memory device testing apparatus has a pattern generator, which generates all of the signals used for a packet signal in one cycle, a pin data selector, which generates the packet signal by selecting some of the signals generated by the pattern generator and outputting the selected signals a plurality of times, a memory device socket, which can write test data into the memory device and read test data from the memory device, and a comparator, which compares expectation value data with test data.

35 Claims, 9 Drawing Sheets

|  |  |  |  |  |
|---|---|---|---|---|
| CA0 | C5 | X8 | 0 | Y0 |
| CA1 | 0 | X9 | 0 | Y1 |
| CA2 | 0 | Y7 | X0 | Y2 |
| CA3 | 0 | Y8 | X1 | Y3 |
| CA4 | 0 | Y9 | X2 | Y4 |
| CA5 | 0 | C0 | X3 | Y5 |
| CA6 | 0 | C1 | X4 | Y6 |
| CA7 | 0 | C2 | X5 | 0 |
| CA8 | 0 | C3 | X6 | 0 |
| CA9 | 0 | C4 | X7 | 0 |

FIG. 5

MEMORY DEVICE TESTING APPARATUS AND DATA SELECTION CIRCUIT

This patent application claims priority based on a Japanese patent application, H10-151881 filed on May 18, 1998, and H10-130060 filed on May 13, 1998, the contents of which are incorporated herein by reference.

BACKGROUND OF THE INVENTION

1. Field of Invention

The present invention relates to a memory device testing apparatus. In particular, the present invention relates to a memory device testing apparatus for testing a packet system memory device.

2. Description of Related Art

FIG. 1 shows a schematic view of a conventional memory device testing apparatus for testing a memory device. This memory device testing apparatus has a pattern generator 10, a pin data selector 20, a waveform shaper 30, a memory device socket 40, and a comparator 50. A memory device 45 is held into a socket 42 on the memory device socket 40 during the test. The pattern generator 10 generates a pattern signal 12, which contains an address, a control signal 25, and data to be provided to the memory device 45. The data contains an expectation value data signal 27, which is compared with output a signal 44 output from the memory device 45 by the comparator 50. The pattern signal 12 generated from the pattern generator 10 is sent to the pin data selector 20.

A test data signal 26 is to be written into the memory device 45 according to the address and the control signal 25 provided to the memory device 45. The expectation value data signal 27 is the expectation value which is expected to output from memory device 45 if the memory device 45 is normal. The expectation value data signal 27 is compared with the output signal 44 read from the memory device socket 40 by comparator 50.

The pin data selector 20 selects the address and the control signal 25, which is part of the pattern signal 12, to allocate the address and the control signal 25 to corresponding pins on the memory device socket 40. The Pin data selector 20 outputs the test data signal 26, which is written into the memory device 45, and the expectation value data signal 27, which is compared with the output signal 44 output from the memory device 45, by the comparator 50. The test data signal 26 and the expectation value data signal 27 have the same signal pattern.

The address and the control signal 25 generated from the pin data selector 20 are sent to the waveform shaper 30. The waveform shaper 30 shapes the waveform of the address and the control signal 25 to adjust the waveform of the address and the control signal 25 to the characteristic of the memory device 45, and the waveform shaper 30 outputs the waveform-shaped address and control signal 32. The waveform shaper 30 also adjusts the timing for providing the signal to the memory device 45. The waveform-shaped address and control signal 32 are provided to the memory device socket 40.

When the control signal 25 means write request, which requests the data to be written, the waveform of the test data signal 26 is shaped by the waveform shaper 30, and the resulting waveform-shaped test data signal 33 is written into the memory device 45. The test data, which is written into the memory device 45, is output from the memory device socket 40 in response to a read request signal generated from the pattern generator 10. The output signal 44 is input to the comparator 50 to be compared with the expectation value data signal 27.

FIG. 2 shows a block diagram of a sub pin data selector 20a in the pin data selector 20. The pin data selector 20 has the same number of sub pin data selectors 20a as the number of signal input pins of the memory device 45. The sub pin data selector 20a has multiplexers 21a and 23a and registers 22a and 24a. The registers 22a and 24a are respectively connected to the control inputs of the multiplexers 21a and 23a.

The pattern signal 12 generated from the pattern generator 10 is input to the multiplexer 21a. The multiplexer 21a is controlled by the register 22a. The register 22a indicates which signal should be selected from the pattern signal 12 to the multiplexer 21a. Then, the multiplexer 21a selects one of the addresses signals and one of the control signals 25a to be provided to a specific pin of the memory device 45.

Here, multiplexer 23a and register 24a are not used. Each of the addresses and control signals 25a selected from each sub pin data selector 20a is sent to the waveform shaper 30. The selected addresses and control signals 25a generate one combined address and control signal 25 as a whole. Address and control signal 25 is sent through the waveform shaper 30 to the memory device socket 40 to the memory device 45.

The test data 26 and the expectation value data signal 27 are also output from the sub pin data selector 20a.

When the test data 26 is supplied to the sub pin data selector 20a, the register 22a indicates which test data signal should be selected from the pattern signal 12 to the multiplexer 21a. Then, the multiplexer 21a selects a test data signal 26a from the pattern signal 12. The waveform of the test data signal 26a is shaped by the waveform shaper 30, and the resulting waveform-shaped test data signal 33a is written into the memory device 45.

The pattern generator 10 provides a read signal to the memory device 45, and the memory device 45 outputs written test data as the output signal 44 to the comparator 50. At that time, the pin data selector 20 outputs the expectation value data signal 27 to the comparator 50. The sub pin data selector 20a selects the expectation value data signal 27a by using the multiplexer 23a and the register 24a in the same way as when the sub pin data selector 20a selects the test data signal 26a. The comparator 50 compares the output signal 44 with the expectation value data signal 27.

As the technology of memory devices has developed, the packet system memory device has come into use, and it is difficult to test packet system memory devices with the conventional memory test apparatus. A packet system memory device is a memory which inputs a plurality of command signals in a packet and writes data sequentially to sequential addresses at high speed. It is important to discover how to generate a test data pattern for testing packet system memory devices.

FIG. 3 shows the pin components of a packet system memory device. This packet system memory device has 10 input pins CA0–CA9 to input address signals and control signals, a clock pin CLK, and 18 data input and output pins DQ0–DQ17. These data input and output pins are divided into 2 sets, DQ0–DQ8 and DQ9–DQ17, and each set inputs and outputs 8 bits of data and 1 parity bit.

FIG. 4 shows an example of a read-write request packet, which is the command signal to be input to the packet system memory device. In this example, a command codes, Cmd5–Cmd0, bank addresses, BNK2–BNK0, row addresses, Row9–Row0, and column addresses, Col6–Col0, are input to the memory device from 10 pins CA0–CA9 over 4 cycles of the clock CLK.

FIG. 5 shows the allocation of tester resources, which corresponds to the read-write request packet shown in FIG. 4. As shown in FIG. 5, multiple signals are allocated to a single pin to input the command signal to the packet system memory device. In this example, 4 signals, C5, X8, 0, and Y0 are allocated to pin CA0. However, the pin data selector 20 of the conventional memory test device can allocate only one signal to a pin. And, the packet signals for each cycle must be generated from the pattern generator 10 to test the packet system memory device with the conventional memory test apparatus.

But it is difficult to generate a packet of signals, which is a block of sequential signals comprising address signals and control signals, by dividing the packet of signals one cycle by one cycle. Especially, as the capacity of memory device become larger, it becomes more difficult to generate the data pattern. In this case, the cost of generating the data pattern increases, so that with the cost of testing memory devices by the conventional memory test apparatus is higher than the market will bear.

Given these problems, it is an object of the present invention to provide a memory device test apparatus, which facilitates the generation of test patterns for packet system memory devices. Also, it is an object of the present invention to provide a circuit which can easily select one output signal from a plurality of signals.

SUMMARY OF THE INVENTION

Therefore, it is an object of the present invention to provide a memory device testing apparatus and a data selection circuit which are capable of solving the problems described above. The object of the present invention can be achieved by the combinations of features described in the independent claims of the present invention. The dependent claims of the present invention define further advantageous embodiments of the present invention The present invention provides a memory device testing apparatus to test a packet system memory device in which input and output data are controlled by plurality of packet signals that contains at least part of an address signal and part of a control signal.

According to the first aspect of the present invention, a memory device testing apparatus for testing a packet system memory device, which is controlled by plurality cycles of a packet signal that contains at least part of an address signal, part of a control signal, part of a test data, and part of an expectation value data that is expected to output from a normal memory device is provided. This memory device testing apparatus has a pattern generator that generates base signals to be used in the plurality cycles of the packet signal in one cycle, a pin data selector that generates each cycle of the packet signal by selecting different signals in each of the plurality cycles from the base signals generated by the pattern generator, and outputting the selected base signals in each of the plurality cycles, a memory device socket which holds the memory device, writes the test data into the memory device, and reads the test data from the memory device by providing each cycle of the packet signal generated by the pin data selector to the memory device, and a comparator that compares the expectation value data generated by the pin data selector with the test data read out from the memory device.

A memory device testing apparatus can be provided such that the pin data selector has a sub pin data selector, which selects an output signal, which constitutes the packet signal, from the base signals in the each cycles and outputs the selected output signal in the each cycles, and a number of the sub pin data selector being larger than a number of signal input pins of the memory device.

A memory device testing apparatus can be provided such that each of the sub pin data selector has a first multiplexer that selects the output signal from the base signals.

A memory device testing apparatus can be provided such that each of the sub pin data selectors has a plurality of registers, which contains a selection data that indicates which the output signal is to be selected from the base signals, and each of the sub pin data selectors selects the output signal according to the selection data.

A memory device testing apparatus can be provide such that each of the sub pin data selectors has a second multiplexer that selects a register from the plurality of registers to output the selection data contained in the selected register, and the first multiplexer selects the output signal according to the selection data output from the second multiplexer.

A memory device testing apparatus can be provided which further has a register selection signal generator which generates a register selection signal to indicate which of a register is to be selected, and the second multiplexer selects the register according to the register selection signal.

A memory device testing apparatus can be provided such that the pattern generator has the register selection signal generator.

A memory device testing apparatus can be provided which further has a waveform shaper that shapes a waveform of the packet signal output from the pin data selector into a type of waveform required by the memory device.

A memory device testing apparatus can be provided such that the contents of the plurality of registers and the register selection signal are programmable according to a type of the memory device.

A memory device testing apparatus can be provided which further has a data selection signal generator which generates a data selection signal that indicates which output signal is to be selected from the base signals, wherein each of the sub pin data selectors has a logic circuit, which inputs some of the base signals and selects the output signal from input base signals in each of the plurality cycles and outputs the output signal in each of the plurality cycles according to the data selection signal.

A memory device testing apparatus can be provided such that the pin data selector has a selector signal selection circuit, which provides each of the output signal output from each of the sub pin data selector to the memory device socket.

A memory device testing apparatus can be provided such that the logic circuit is a programmable logic circuit, and contents of the logic circuit and the data selection signal are programmable according to a type of the memory device.

According to still other aspect of the present invention, a memory device testing apparatus for testing a memory device is provided. The memory device testing apparatus has a pattern generator that generates data signals to be used in a test data which is to be provided to the memory device, a pin data selector that generates the test data and a expectation value data, which is expected to output from a normal memory device, by selecting some of the data signals generated by the pattern generator and outputting the selected data signals plurality times, a memory device socket which holds the memory device, writes the test data into the memory device, and reads the test data from the memory device, and a comparator that compares the expectation value data generated by the pin data selector with the test data read out from the memory device.

A memory device testing apparatus can be provided such that the pin data selector has a sub pin data selector which selects the test data and the expectation value data from the data signals and outputs the test data and the expectation value data plurality times, and a number of the sub pin data selector being larger than a number of signal input pins of the memory device, and each of the sub pin data selectors has a test data selection circuit which selects the test data from the data signals.

A memory device testing apparatus can be provided such that the test data selection circuit has a first multiplexer that selects the test data from the data signals.

A memory device testing apparatus can be provided such that the test data selection circuit has a plurality of registers, which contains a selection data that indicates which the test data is to be selected from the data signals, and the test data selection circuit selects the test data according to the selection data contained in the plurality of registers.

A memory device testing apparatus can be provided such that the test data selection circuit has a second multiplexer that selects a register from the plurality of registers to output the selection data contained in the selected register, and the first multiplexer selects the test data according to the selection data output from the second multiplexer.

A memory device testing apparatus can be provided which further has a waveform shaper that shapes a waveform of the test data generated by the pin data selector into a type of waveform required by the memory device.

A memory device testing apparatus can be provided which further has a data selection signal generator which generates a data selection signal that indicates which the test data is to be selected from the data signals generated by the pattern generator, wherein each of the test data selection circuits has a logic circuit, which inputs some of the data signals generated by the pattern generator and selects the test data from the input data signals and outputs the test data according to the data selection signal.

A memory device testing apparatus can be provided such that the pin data selector has a selector signal selection circuit, which provides each of the test data output from each of the test data selection circuit to the memory device socket.

A memory device testing apparatus can be provided such that each of the sub pin data selectors further has an expectation value data selection circuit to select the expectation value data from the data signals and output the expectation value data to the comparator.

A memory device testing apparatus can be provided such that the expectation value data selection circuit has a first multiplexer that selects the expectation value data from the data signals.

A memory device testing apparatus can be provided such that the expectation value data selection circuit has a plurality of registers, which contains a selection data that indicates which the expectation value data is to be selected from the data signals, and the expectation value data selection circuit selects the expectation value data according to the selection data contained in the plurality of registers.

A memory device testing apparatus can be provided such that each of the expectation value data selection circuits has a second multiplexer that selects a register from the plurality of registers to output the selection data contained in the selected register, and the first multiplexer selects the expectation value data according to the selection data output from the second multiplexer.

A memory device testing apparatus can be provided which further has a register selection signal generator which generates a register selection signal to indicate which of the register is to be selected, and the second multiplexer selects the register according to the register selection signal.

A memory device testing apparatus can be provided which further has a data selection signal generator which generates a data selection signal that indicates which the expectation value data is to be selected from the data signals generated by the pattern generator, wherein each of the expectation value data selection circuits has a logic circuit, which inputs some of the data signals generated by the pattern generator and selects the expectation value data from the data signals and outputs the expectation value data to the comparator according to the data selection signal.

A memory device testing apparatus can be provided such that the pin data selector has a selector signal selection circuit, which provides each of the expectation value data output from each of the expectation value data selection circuit to the memory device socket.

According to still other aspect of the present invention, a data selection circuit, which selects an output signal from plurality signals and outputs the output signal, is provided. The data selection circuit has a first multiplexer in which the plurality signals are input, a plurality of registers, which contains a selection data that indicates which the output signal is to be selected, a second multiplexer that selects a register from the plurality of registers to output the selection data contained in the selected register, and the first multiplexer selects the output signal according to the selection data output from the second multiplexer.

According to still other aspect of the present invention, a data selection circuit, which selects an output signal from plurality signals and outputs the output signal, is provided. The data selection circuit has a logic circuit, which inputs some of the plurality signals and selects the output signal from the input signals and outputs the selected output signal according to a data selection signal that indicates which the output signal is to be selected from the input signals.

BRIEF DESCRIPTION OF THE DRAWINGS

FIG. 5 shows an example of the allocation of tester resources corresponding to the read-write request packet shown in FIG. 4.

DETAILED DESCRIPTION OF THE INVENTION

The present invention will be explained with reference to embodiments of the present invention. The following embodiments, however, do not limit the scope of the present invention described in the claims. Moreover, not all the combinations of features described in the embodiments are necessarily essential for the present invention.

Figure 1:
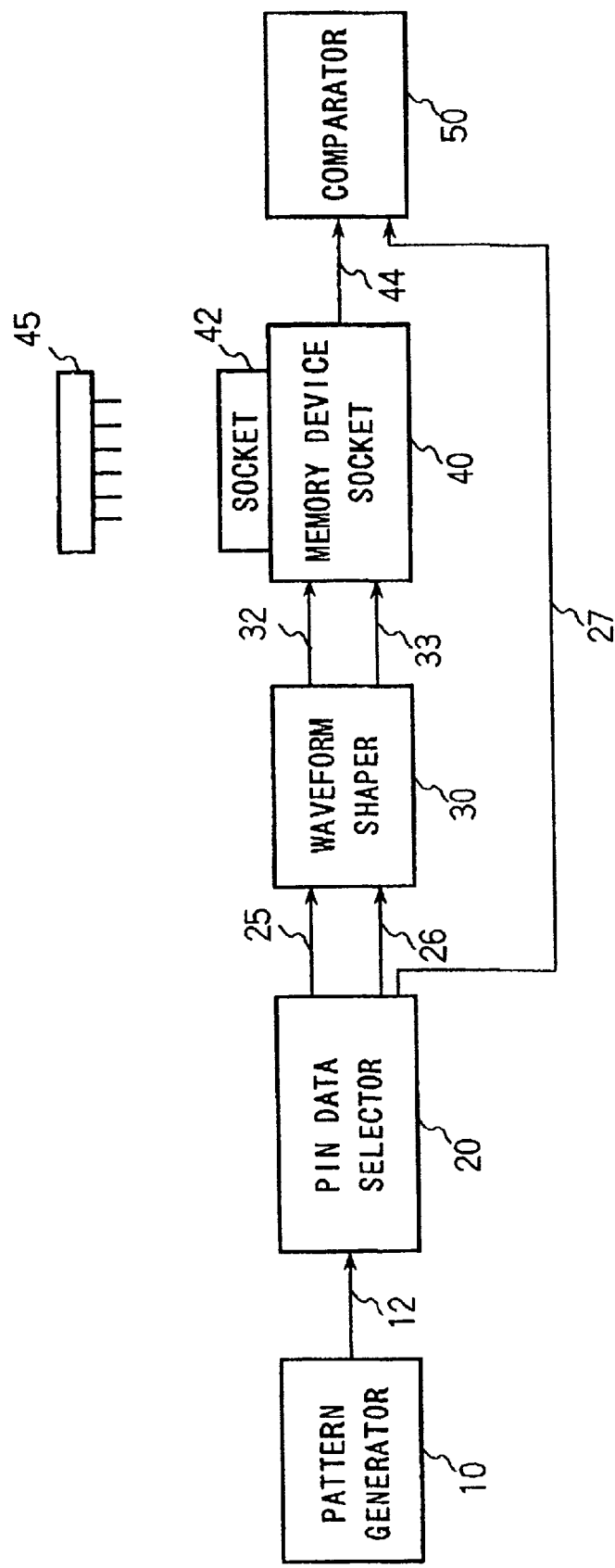
FIG. 1 shows an example of a conventional memory device testing apparatus.
Figure 2:
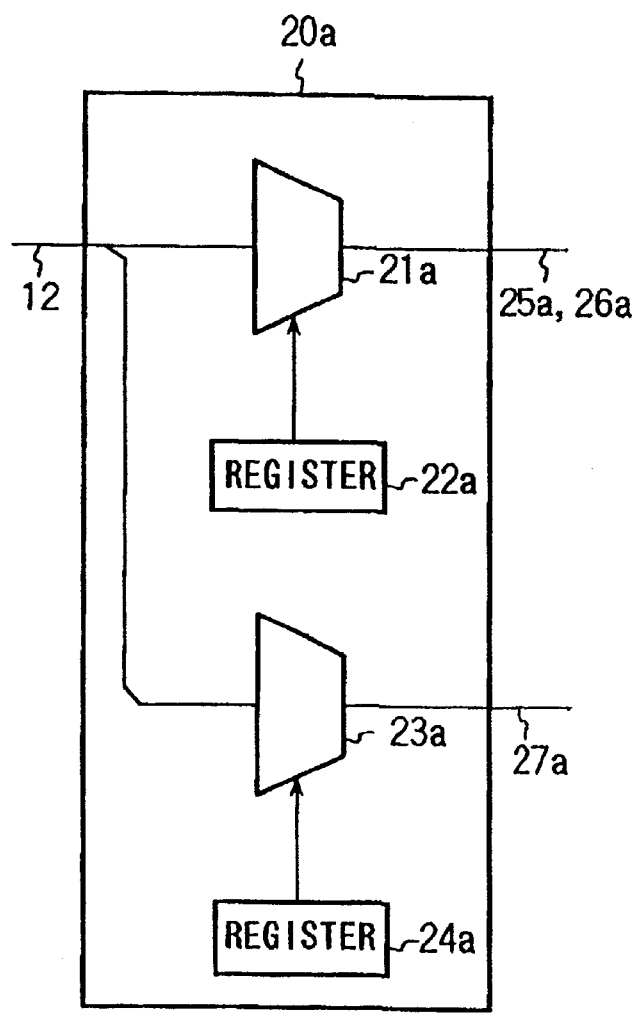
FIG. 2 shows a sub pin data selector 20a in pin data selector 20 shown in FIG. 1.
Figure 6:
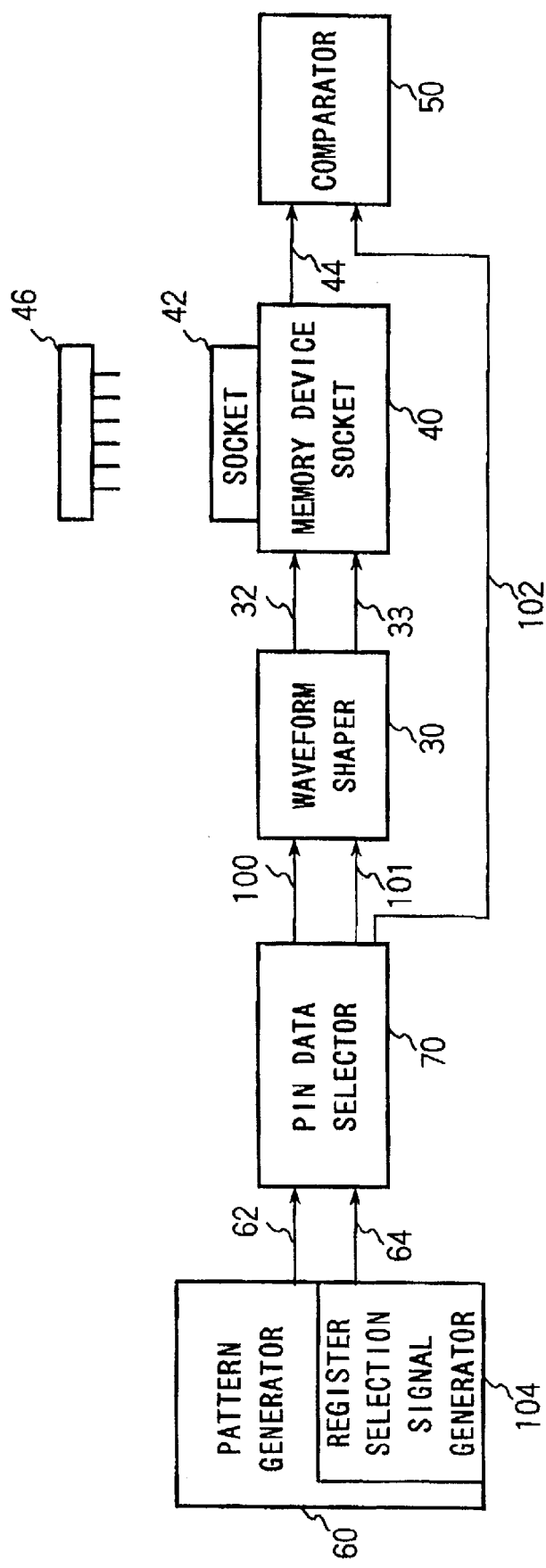
FIG. 6 shows a memory device testing apparatus of the present invention.

FIG. 6 shows the memory device testing apparatus according to the first embodiment of present invention. The components shown in FIG. 6, which have same reference numerals as in FIG. 1, have the same structure as the components shown in FIG. 1, and thus the explanations of the components shown in FIG. 6 will be omitted. The memory device testing apparatus according to the first embodiment of the present invention has a pattern generator 60, a pin data selector 70, a waveform shaper 30, a memory device socket 40, and a comparator 50. The memory device 46 to be tested is a packet system memory device. The memory device 46 has the pin components shown in FIG. 3. The memory device 46 is held into a socket 42 on the memory device socket 40, and is tested to be determined whether the memory device 46 is normal.

Figure 4:
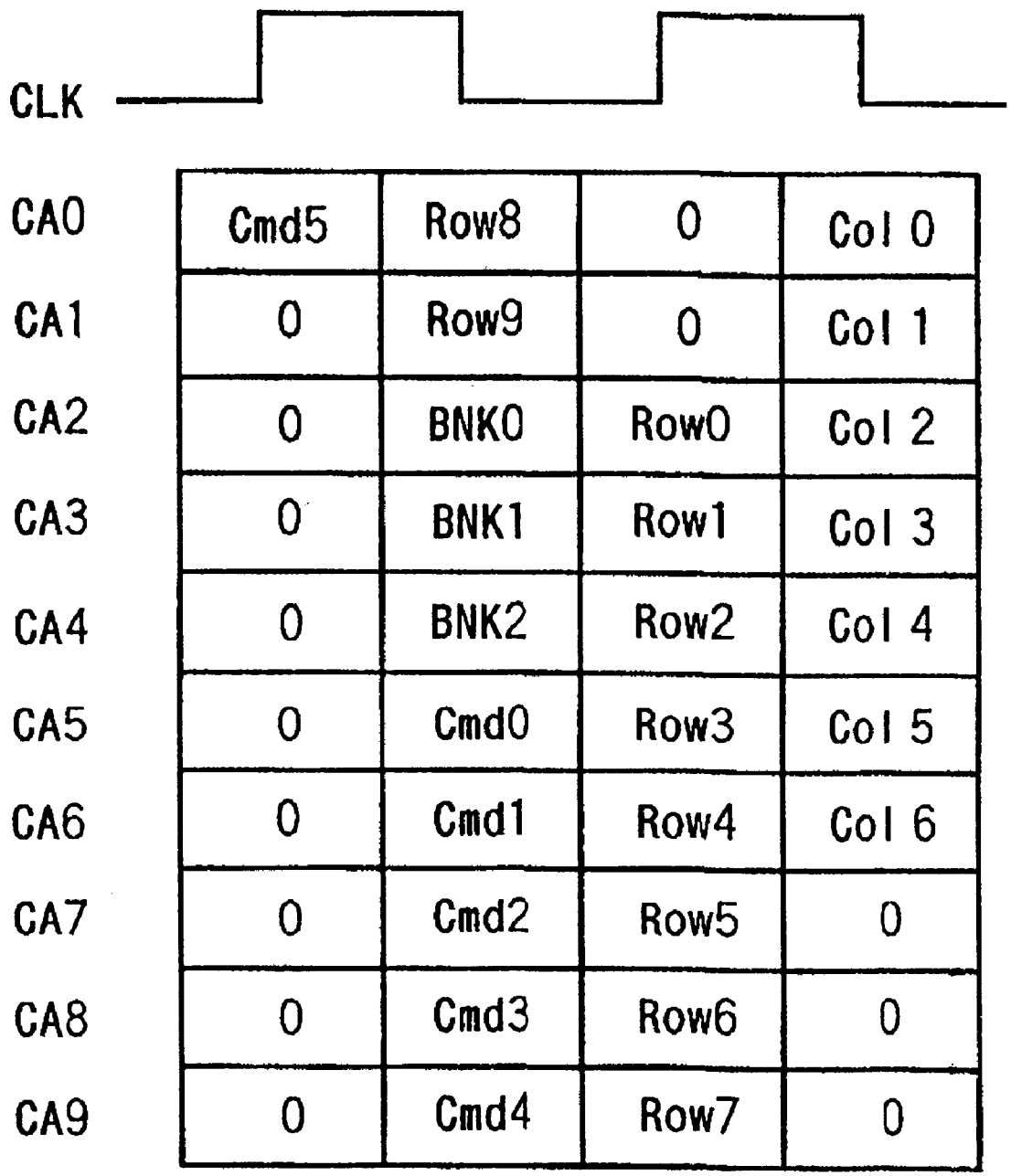
FIG. 4 shows an example of a read-write request packet signal, which is a command signal to be input in a packet system memory device.

The pattern generator 60 generates address signals, control signals, data signals and so on. The plurality cycles of packet command signals that include command code signals, bank address signals, row address signals, and column address signals shown in FIG. 4 is input into the packet system memory device 46. The data signals may include test data that is written to the packet system memory device. Unlike the pattern generator 10 explained in the description of related art, the pattern generator 60 generates all the signals required by the packet system memory device 46 for inputting or outputting data in one clock cycle. Because the pattern generator 10, which is used in the conventional memory device testing apparatus, could not generate a plurality cycles of signals at once, the pattern generator 10 generated a packet signal divided into single-cycle signals. The pattern signal 62 generated by the pattern generator 60 is sent to the pin data selector 70.

The pattern generator 60 has a register selection signal generator 104 that provides a register selection signal 64 to the pin data selector 70. The register selection signal generator 104 does not need to be located inside the pattern generator 60, but can be located outside of the pattern generator 60. The relationship between the register selection signal 64 and the pin data selector 70 will be described later referring to FIG. 7.

The pin data selector 70 selects the pattern signal 62, which is generated by the pattern generator 60, to allocate pattern signal 62 to each of the corresponding pins of the memory device socket 40. Because the pattern generator 60 generates all of the signals required by the packet system memory device 46 in one cycle, the pin data selector 70 divides a command signal 100 within the pattern signal 62 into plurality cycles and outputs command signal 100 as a packet signal. The pin data selector 70 also outputs a test data signal 101 to be written to the packet system memory device 46, and the pin data selector 70 outputs an expectation value data signal 102 to be sent to the comparator 50.

The command signal 100 selected by the pin data selector 70 is sent to the waveform shaper 30. The waveform shaper 30 shapes the waveform of a signal according to the characteristic of the packet system memory device 46. The waveform shaper 30 also adjusts the timing of providing the command signal 100 to the packet system memory device 46. The waveform-shaped command signal 32 is the command signal of which waveform is shaped by the waveform shaper 30, The waveform-shaped command signal 32 is provided to the memory device socket 40 as a packet signal in plurality cycles. When the address signal and the control signal included in the command signal 100 request to write data, the test data provided by the test data signal 101 is written to the packet system memory device 46. When the command signal 100, which is input in the packet system memory device 46 requests to read data, the written test data is read from the packet system memory device 46. The resultant output signal 44 read out from the packet system memory device 46, is sent to the comparator 50. The pin data selector 70 generates not only the test data signal 101, but also the expectation value data signal 102, which is expected to output from memory device 46 if the memory device 46 is normal. The expectation value data signal 102 is sent to the comparator 50, and is compared with the output signal 44.

Figure 7:
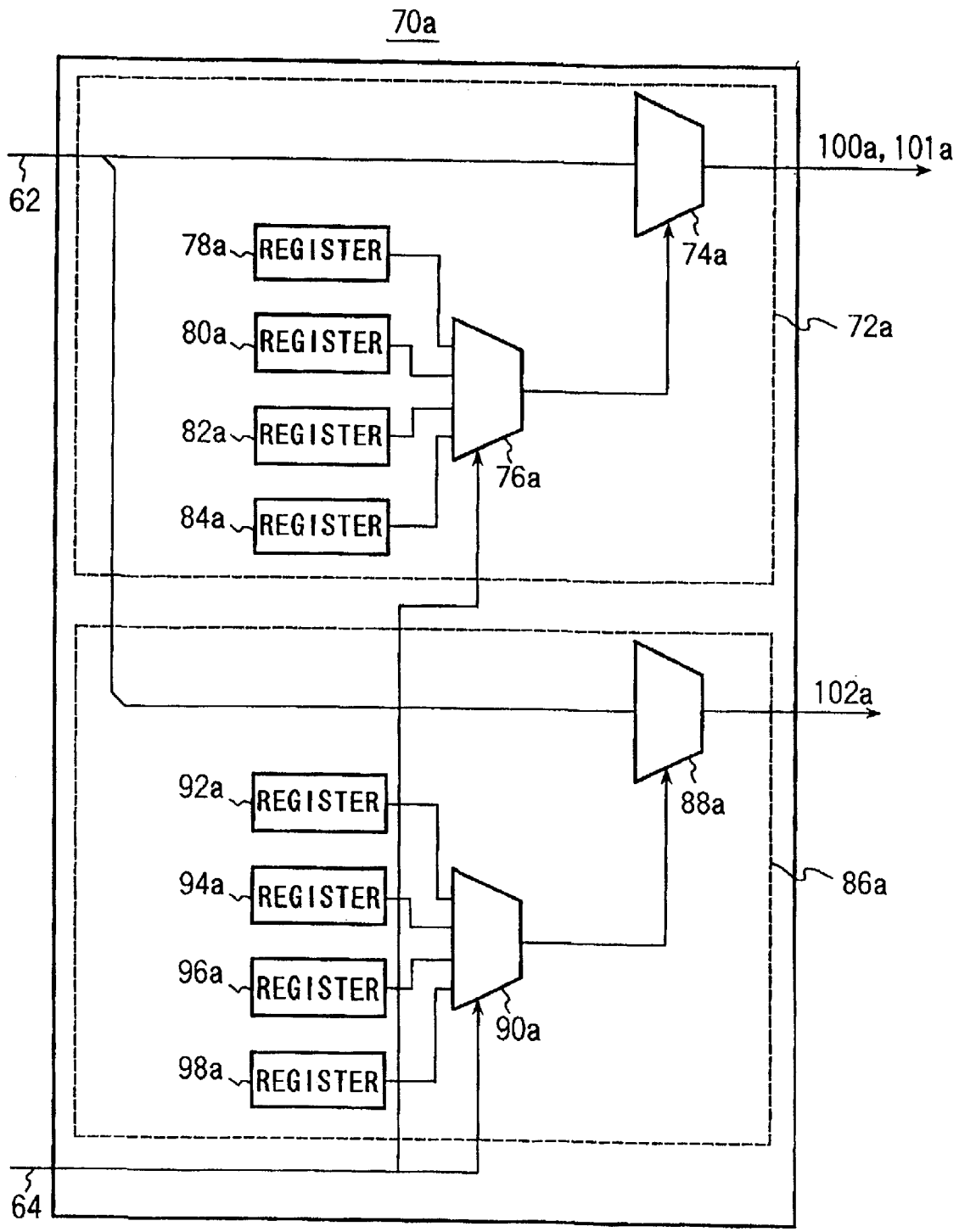
FIG. 7 shows the pin data selector 70 shown in FIG. 6.

FIG. 7 shows the circuit diagram of a sub pin data selector 70a according to the present invention. The pin data selector 70 has at least as many sub pin data selectors 70a as the number of signal input pins of the packet system memory device 46. In other words, each of the sub pin data selectors 70a corresponds to one of the plurality of signal input pins of the packet system memory device 46. Each sub pin data selector 70a has 2 data selection circuits 72a and 86a. Depending on the signal to be transmitted, only one of the data selection circuits 72a or 86a may be used. To make the sub pin data selector 70a usable for many kinds of packet system memory devices 46, all of the sub pin data selectors 70a have 2 data selection circuits, so that the memory device testing apparatus can be used for many kinds of memory devices.

Data selection circuit 72a has 2 multiplexers 74a and 76a, and 4 registers 78a, 80a, 82a, and 84a. The multiplexer 74a inputs the pattern signal 62, which is generated by the pattern generator 60. The multiplexer 76a is connected to the control input of the multiplexer 74a, and the multiplexer 76a controls the output of multiplexer 74a. The registers 78a, 80a, 82a, and 84a are connected to the input of the multiplexer 76a.

Data selection circuit 86a has 2 multiplexers 88a and 90a, and 4 registers 92a, 94a, 96a, and 98a. The multiplexer 88a inputs the pattern signal 62, which is generated by the pattern generator 60. The multiplexer 90a is connected to the control input of the multiplexer 88a, and the multiplexer 90a controls the output of the multiplexer 88a. The registers 92a, 94a, 96a, and 98a are connected to the input of the multiplexer 90a. As shown in FIG. 7, the data selection circuit 72a and the data selection circuit 86a have the same structure.

The characteristics of the input of the packet system memory device will now be explained. To input data into a conventional memory device, a control signal and an address signal such as, RAS, CAS, etc were provided to the conventional memory device to input 1 bit of data. In contrast, to write data to the packet system memory device, a command signal which includes address signals and control signals is provided. Then, 8 bits of data are sequentially written into the memory device several clock cycles after the input of the command signal. During the input of a data signal in to the memory device, another address signal and control signal are transmitted to the memory device, and thus data can be input to the memory device continuously. Compare to the conventional memory device, the packet system memory device can input or output a large amount of data within a short time.

The operations of the sub pin data selector 70a will now be explained based on the characteristics of the packet system memory device as explained above. Because the data selection circuits 72a and 86a have the same structure, primarily the data selection circuit 72a will be explained. First, the operations of the data selection circuit 72a involved in selecting the command signal 100 from the pattern signal 62 will be explained.

The pattern signal 62 that is received by the multiplexer 74a includes both of the command signals and the data signals. The pattern signal 62, which is not divided into plurality cycles as is the packet signal, is sent to the sub pin data selector 74a in one cycle. For example, in the case of generating the packet signal shown in FIG. 5, the signals to be provided to pin CA0 of the packet system memory device 46 are the 4 signals C5, X8, 0, and Y0. In this case, it is desirable that the number of registers 78a, 80a, 82a, and 84a be at least 4. That is to say, it is desirable that the data selection circuit 72a has at least as many registers as the number of cycles of the packet signal to be generated. The type of packet system memory device determines the number of cycles of the packet signal. Therefore, it is desirable that the sub pin data selector 70a have as many registers as possible so that the memory device testing apparatus of the present invention can be used to test various kinds of packet system memory devices.

In this example, the register 78a contains selection data indicating that C5 is to be selected, the register 80a contains selection data indicating that X8 is to be selected, the register 82a contains selection data indicating that 0 is to be selected, and the register 84a contains selection data indicating that Y0 is to be selected. The outputs of the registers 78a, 80a, 82a, and 84a are connected to the input of the multiplexer 76a. The register selection signal 64 generated by the register selection signal generator 104 is connected to the control input of the multiplexer 76a to designate which register should be selected from the registers 78a, 80a, 82a, and 84a.

In this example, the register selection signal generator 104 generates one of 0, 1, 2, and 3, which are the 4 types of register selection signals 64. Each of the 4 types of register selection signal corresponds to one of the 4 registers 78a, 80a, 82a, and 84a. The value of the register selection signal 64 is set so as to indicate which register is to be selected. For example, when the value of the register selection signal 64 is 0, the multiplexer 76a selects the register 78a. The register 78a contains the selection data that selects C5. The selection data that selects C5 is output from the multiplexer 76a and input to the control input of the multiplexer 74a. The multiplexer 74a selects C5 from the pattern signal 62 and provides C5 to the waveform shaper 30.

When the value of the register selection signal 64 is 1, the multiplexer 76a selects the register 80a. The register 80a contains the selection data that selects X8. The selection data that selects X8 is output from the multiplexer 76a and input to the control input of the multiplexer 74a. The multiplexer 74a selects X8 from the pattern signal 62 and provides X8 to the waveform shaper 30. When the value of the register selection signal 64 is 2, the multiplexer 76a selects the register 82a. The register 82a contains the selection data that selects 0. The selection data that selects 0 is output from the multiplexer 76a and input to the control input of the multiplexer 74a. The multiplexer 74a selects 0 from the pattern signal 62 and provides 0 to the waveform shaper 30. When the value of the register selection signal 64 is 3, the multiplexer 76a selects the register 84a. The register 84a contains the selection data that selects Y0. The selection data that selects Y0 is output from the multiplexer 76a and input to the control input of the multiplexer 74a. The multiplexer 74a selects Y0 from the pattern signal 62 and provides Y0 to the waveform shaper 30. In this way, the 4 cycles of the signal, C5, X8, 0, and Y0, are input to the waveform shaper 30.

Figure 3:
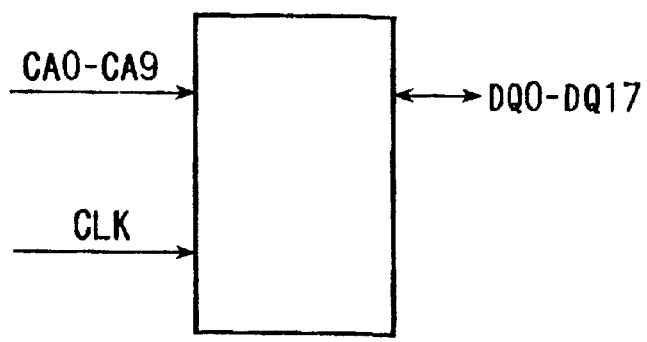
FIG. 3 shows an example of pin components of a packet system memory device, and also an example of a packet system memory device used in the detailed description of the invention.

For the rest of the pins CA1–CA9 shown in FIG. 3, the corresponding sub pin data selector 70a for each pin operates the same way as the sub pin data selector 70a which corresponds to pin CA0 operates. Each sub pin data selector 70a selects 4 command signals 100a. Then, the command signals 100a which output from each of the sub pin data selector 70a together constitute the command signal 100 shown in FIG. 4.

The operations of the sub pin data selector 70a involved in selecting a data signal will now be explained. The test data signal 101 and the expectation value data signal 102 are output from a sub pin data selector that has the same structure ass the sub pin data selector 70a shown in FIG. 7. The operation of the pin data selector 70 that selects the test data signal 101 and the expectation value data signal 102 will now be explained referring to FIG. 7.

There are various ways of providing the data signal to the memory device. In the first embodiment of the present invention, the data signal is multiplexed before being sent to the memory device 46. The memory device testing apparatus requires 2 kinds of data. These are the test data, which is once written into the memory device 46 and read out from the memory device 46, and the expectation value data, which is the correct data. The data selection circuit 72a is used to generate a test data signal 101a, and the data selection circuit 86a is used to generate an expectation value data signal 102a. For example, the case will be examined in which the pattern generator 60 outputs a 36 bits data signal, and the pin data selector 70 multiplexes the 36 bits data signal to 18 bits×2. The 36 bit data signal contains a 32-bit test data signal or expectation value data signal, 8 bits×4, and 4 parity bits, 1 bit×4 as was explained in reference to FIG. 3. The 36 bits of data D0–D35 generated by the pattern generator 60 are allocated to one of the 18 pins DQ0–DQ17 shown in FIG. 3. Because the data selection circuits 72a and 86a have the same structure, the operation of the data selection circuit 72a will primarily be explained.

To multiplex the test data signal, 18 sub pin data selectors are needed. Two registers, 78a and 80a, are used in the data selection circuit 72a. The registers 82a and 84a are not used. If the data signals D0 and D1 provided from the pattern generator 60 are the data to be input to data input and output pin DQ0, the register 78a contains selection data which select data D0, and the register 80a contains selection data which select data D1. The multiplexer 74a inputs the pattern signal 62, which includes all the data D0–D35. When the register selection signal 64 generated by the register selection signal generator 104 is 0, the multiplexer 76a selects the register 78a, and the selection data contained in the register 78a is output from the multiplexer 76a. According to the selection data contained in the register 78a, the multiplexer 74a selects the data D0 and outputs D0 to the waveform shaper 30. When the register selection signal 64 is 1, the register 80a is selected. According to the selection data contained in the register 80a, the multiplexer 74a selects the data D1 and outputs D1 to the waveform shaper 30. As a result, 2 data signals 101a, which are to be allocated to data input and output pin DQ0, are output. Similarly, 2 multiplexed data signals are allocated to the other 17 data input and output pins. As a result, 18 multiplexed data signals 101a generate a test data signal 101.

Similarly, expectation value data signals 102 are also generated by the data selection circuit 86a and sent to the comparator 50.

The test data signals 101 are provided to the waveform shaper 30 in order to shape the waveform of test data signals 101. The waveform shaper 30 shapes the waveform of a test data signal 101, which is to be provided to the memory device 46, according to the set up time or hold time requested by the memory device 46. The resultant waveform-shaped test data signal 33 is written into the packet system memory device 46. The comparator 50 reads the written test data provided as output signal 44 from the packet system memory device 46. The comparator 50 compares the output signal 44, which is read from the packet system memory device 46, and the expectation value data signal 102. If the output signal 44 and the expectation value data signal 102 are shown to be the same by the comparison, then the packet system memory device 46 being tested is normal.

It is desirable that the memory contents of the registers 78a–84a and 92a–98a, and also the register selection signal 64 generated by the register selection signal generator 104, be programmable s o that many kinds of memory devices can be tested.

Figure 8:
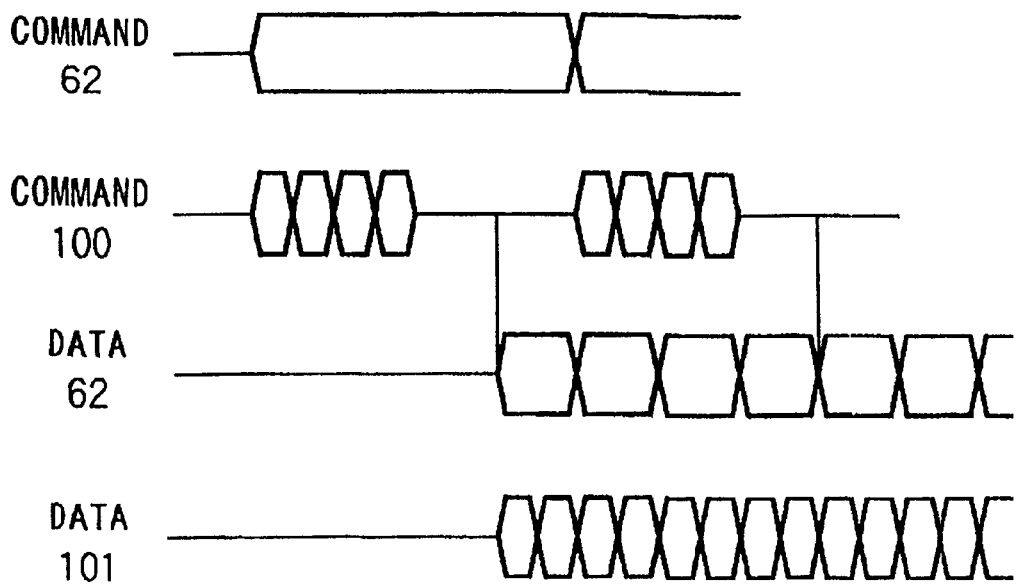
FIG. 8 shows a timing chart according to the first embodiment of the present invention when a command signal 100 is write-requested.

FIG. 8 shows the timing chart of the signal of the first embodiment of the present invention when the command signal 100 is a write request signal that requests that data be written. The command signal 100 requests 8 words of data to be written. The signals shown in FIG. 8 are the pattern signal 62, the command signal 100, and the test data signal 101. First of all, the pattern generator 60 generates the pattern signal 62.

Each of the components that constitute the command signal in the pattern signal 62 is output as the command signal 100 in the course of 4 cycles. The pattern generator 60 generates a 2-word width of the test data 4 times for every 2 cycles several clock cycles after the input of 4 cycles of the command signal 100. The pin data selector 70 selects and outputs the test data signal 101 from the 2-word width of test data for every cycle. The command signal 100 is output for every constant cycle. In FIG. 8, the command signal 100 is output so as not to have any space between the 8 words of sequential data so that the test data can be written into the memory device 46 in a short time.

Figure 9:
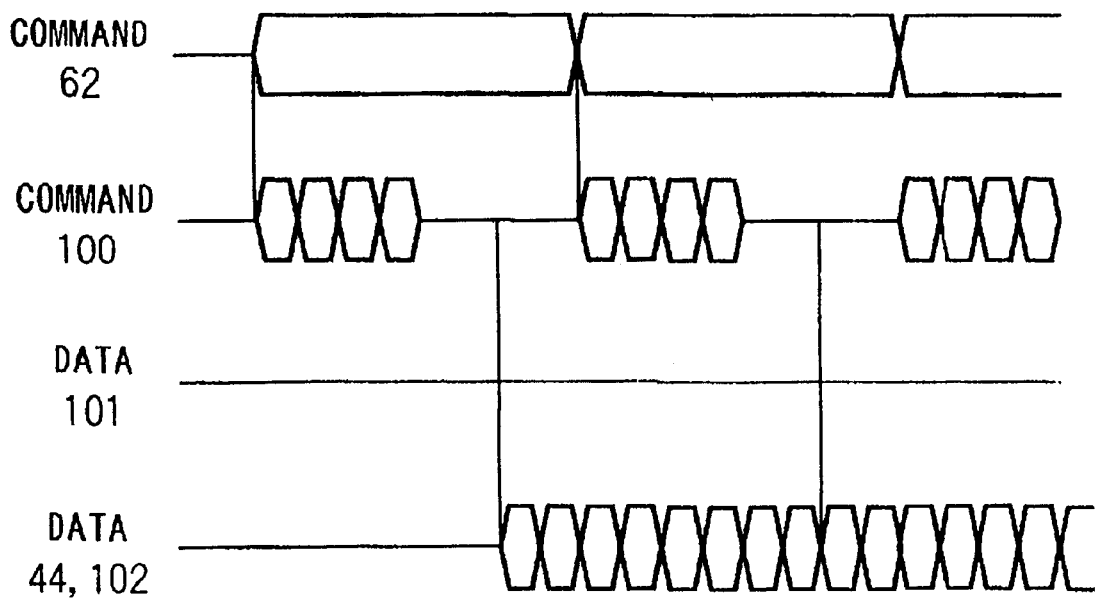
FIG. 9 shows a timing chart according to the first embodiment of the present invention when command signal 100 is read-request.

FIG. 9 shows the timing chart of the signals of the embodiment of the present invention when the command signal 100 is a read request signal that requests that data be read. The command signal 100 requests 8 words of data to be read sequentially. The signals shown in FIG. 9 are the components of the command signal in the pattern signal 62, the command signal 100, the test data signal 101, the output signal 44, and the expectation value data signal 102. The test data signal 101 is not output when the comparator 50 compares the output signal 44 and the expectation value data signal 102. The output signal 44 and the expectation value data signal 102 are synchronized and output to the comparator 50. The comparator 50 compares the output signal 44 and the expectation value data signal 102 to determine whether the packet system memory device is normal or not.

Figure 10:
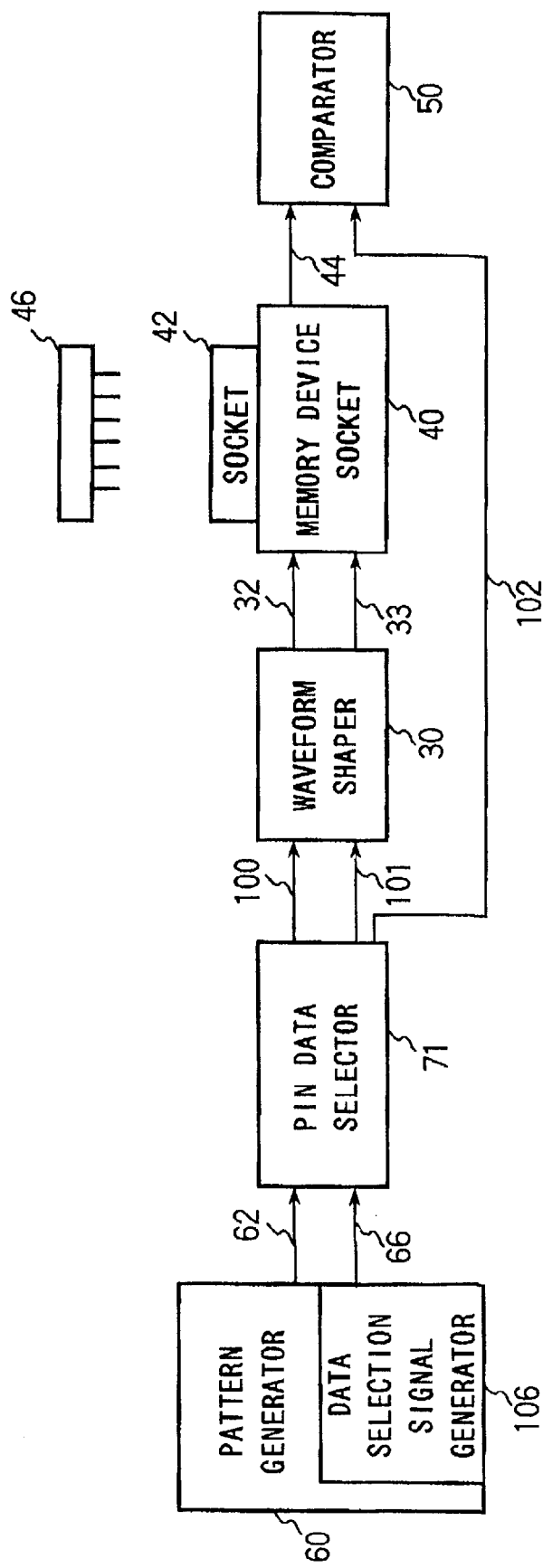
FIG. 10 shows another example of a memory device testing apparatus of the present invention.

FIG. 10 shows the second embodiment of the memory device testing apparatus. The explanation for the components shown in FIG. 10 that have the same reference numerals as the components shown in FIG. 6 will be omitted because these components have the same structure. The memory device testing apparatus of the second embodiment has a pattern generator 60, a pin data selector 71, a waveform shaper 30, a memory device socket 40, and a comparator 50. The memory device 46 to be tested is a packet system memory device. The memory device 46 is held into the socket 42 in the memory device socket 40 to be tested to determine whether the memory device 46 is normal. The pattern generator 60 of the second embodiment has the same structure as the pattern generator 60 shown in FIG. 6 except that the pattern generator 60 of the second embodiment has a data selection signal generator 106 instead of the register selection signal generator 104 shown in FIG. 6. The data selection signal generator 106 does not have to be located inside the pattern generator 60, but can be located outside the pattern generator 60.

The pin data selector 71 selects the pattern signal 62, which is generated by the pattern generator 60, to allocate the pattern signal 62 to each of the corresponding pins of memory device socket 40. Because the pattern generator 60 generates all the signals required by the packet system memory device 46 in one cycle, the pin data selector 71 divides the command signal within the pattern signal 62 into plurality cycles and outputs the divided command signals as a packet signal. The pin data selector 71 also outputs a test data signal 101, which is to be written to the memory device 46, and an expectation value data signal 102, which is to be sent to the comparator 50. The waveform shaper 30, the memory device socket 42, and the comparator 50 have the same structure as the waveform shaper 30, the memory device socket 42, and the comparator 50 shown in FIG. 6, so that the explanation of these is omitted.

Figure 11:
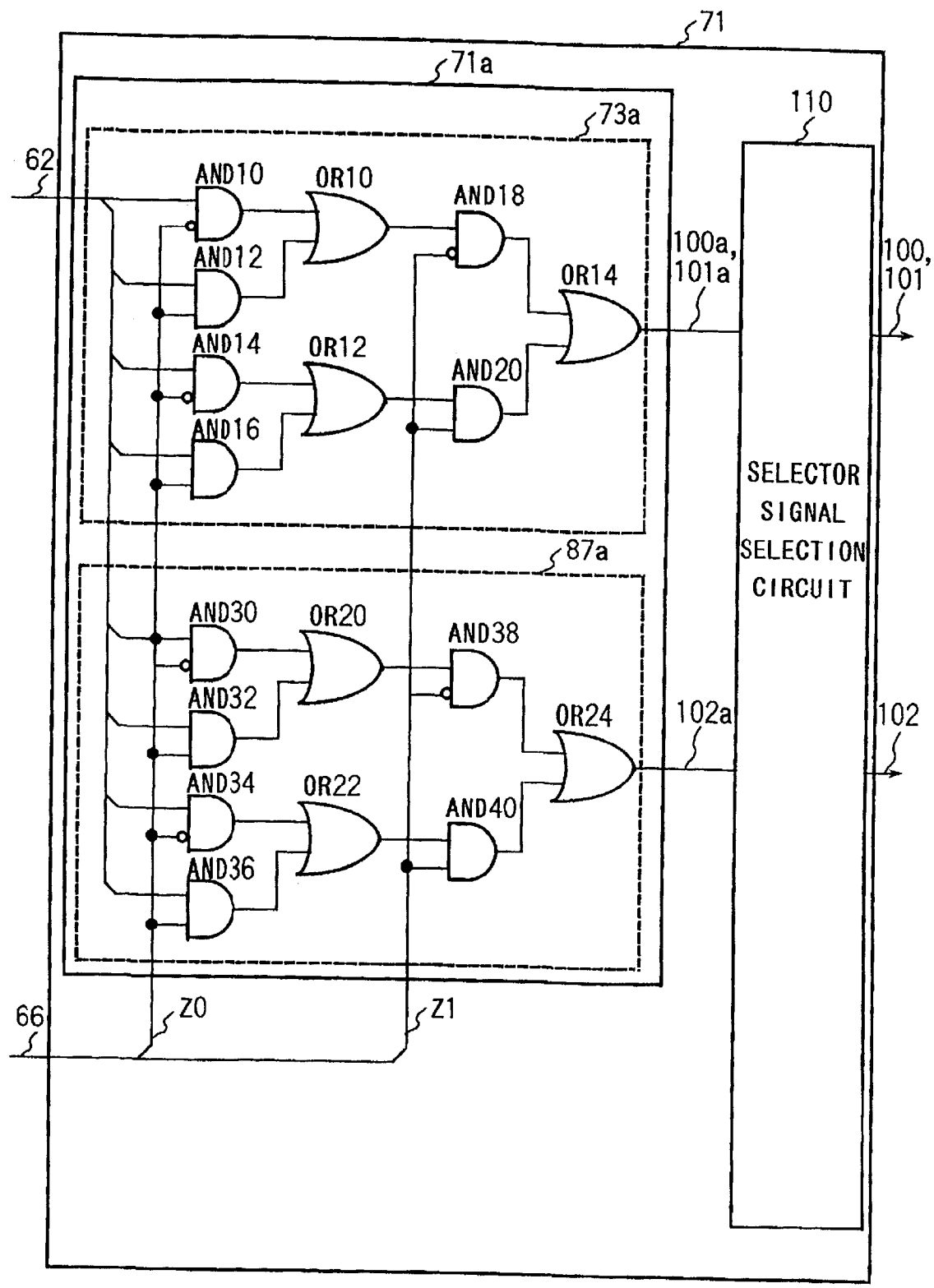
FIG. 11 shows the pin data selector 71, shown in FIG. 10.

FIG. 11 shows a circuit diagram of the pin data selector 71 of the second embodiment of the present invention. The pin data selector 71 has at least as many sub pin data selectors 71a as the number of signal input pins of the packet system memory device 46. The pin data selector 71 has a selector signal selection circuit 110, which selects the outputs generated by the plurality of sub pin data selectors 71a, to allocate each output to the corresponding pin of the memory device socket 40. Each sub pin data selector 71a has 2 data selection circuits 73a and 87a. Either one of the data selection circuits 73a or 87a is used depending on the signal to be transmitted. Each data selection circuit 73a has a logic circuit. The logic circuit inputs 4 signals from the pattern signal 62, and the logic circuit selects one signal from the 4 signals according to a data selection signal 66, and the logic circuit outputs the selected one signal as a command signal 100a. The data selection circuit 73a has AND gates AND10, AND12, AND14, AND16, AND18, and AND20, and OR gates OR10, OR12, and OR14. The data selection circuits 73a and 87a have the same structure.

The data selection circuit 73a will primarily be explained in the following embodiment. The operation of the data selection circuit 73a in selecting the command signal 100a from the pattern signal 62 will be explained first. The pattern signal 62, which is received by the sub pin data selector 71a, includes a part of the command signal 100a and the test data signal 101a. The pattern signal 62 is sent to the sub pin data selector 71a in a single cycle. For example, the signals to be provided to pin CA0 of the packet system memory device 46 are the 4 signals C5, X8, 0, and Y0, in the case of generating the packet signal shown in FIG. 5.

The signal C5 is input to the AND gate AND10, the signal X8 is input to the AND gate AND12, the signal 0 is input to the AND gate AND14, and the signal Y0 is input to the AND gate AND16 in this example. The data selection signal 66, which is input to AND gates AND10, AND12, AND14, AND16, AND18, and AND20, is expressed by combinations of the signals Z0 and Z1. The data selection signal 66 (Z0, Z1) has 4 combinations, (0,0), (1,0), (0,1), and (1,1). The data selection signal generator 106 generates one of these 4 combinations of the selection signals 66, (0,0), (1,0), (0,1), or (1,1).

For example, when the data selection signal 66 (Z0, Z1) is (0,0), the data selection signal 66 of Z0=0 is input to AND gates AND10, AND12, AND14, and AND16. The AND gates AND10 and AND14 respectively provide the signals C5 and 0 to the OR gates OR10 and OR12. The OR gate OR10 provides the signal C5, which is output from the AND gate AND10, to the AND gate AND18. The OR gate OR12 provides the signal 0, which is output from the AND gate AND14, to the AND gate AND20. Then, the data selection signal 66 of Z1=0 is input to the AND gate AND18, and the AND gate AND18 provides the signal of C5 to the OR gate OR14. The OR gate OR14 provides the signal C5, which is output from the AND gate AND18, to the selector signal selection circuit 110.

In similar fashion, when the data selection signal 66 (Z0, Z1) is (1,0), pattern signal 62 consisting of X8 passes through the AND gate AND12, the OR gate OR10, the AND gate AND18, and the OR gate OR14, and then is provided to the selector signal selection circuit 110. When the data selection signal 66 (Z0, Z1) is (0,1), the pattern signal 62 consisting of 0 passes through the AND gate AND14, the OR gate OR12, the AND gate AND20, and the OR gate OR14, and is then provided to the selector signal selection circuit 110. When the data selection signal 66 (Z0, Z1) is (1,1), the pattern signal 62 consisting of Y0 passes through the AND gate AND16, the OR gate OR12, the AND gate AND20, and the OR gate OR14, and is then provided to the selector signal selection circuit 110.

The selector signal selection circuit 110 selects each output generated by the plurality of sub pin data selectors 71a to allocate the outputs to the corresponding pins of the memory device socket 40. Then, the selector signal selection circuit 110 provides the selected output to the waveform shaper 30. In this way, the data selection signal 66 (Z0, Z1) is input to the pin data selector 71 one by one as (0,0), (1,0), (0,1), and (1,1). Then, the pin data selector 71 provides 4 cycles of signals, C5, X8, 0, and Y0, one by one, to the waveform shaper 30.

For the rest of the pins, that is, the pins CA1–CA9 shown in FIG. 3, corresponding sub pin data selectors 71a operate in the same way as the sub pin data selector 71a which corresponds to pin CA0 operates. The selector signal selection circuit 110 selects each output, which is generated by the plurality of data selection circuits 73a, to allocate the outputs to the corresponding pins on the memory device socket 40. In this way, the outputs of the pin data selector 71 constitute the packet signal shown in FIG. 4. In the same way, in the case of selecting a data signal, the pin data selector 71 selects a test data signal 101a by the data selection circuit 73a and selects an expectation value data signal 102a by the data selection circuit 87a. The selector signal selection circuit 110 selects each output generated by the data selection circuits 73a and 87a to allocate the outputs to the corresponding pins of the memory device socket 40. Then, the selector signal selection circuit 110 outputs the test data signal 101 to the waveform shaper 30 and the expectation value data signal 102 to the comparator 50.

It is desirable to construct the data selection circuits 73a and 87a using programmable logic circuits so that the data selection circuits 73a and 87a can be programmable. For example, in the case of providing the 4 pattern signals 62, C5, X8, 0, and Y0, to the data selection circuit 73a, the logic circuit of the data selection circuit 73a may be described by the following logical operation.

((((. NOT.Z0). AND.C5). OR. (Z0.AND.X8)). AND. (.NOT.Z1)).OR.

((((. NOT.Z0). AND.0). OR. (Z0.AND.Y0)). AND.Z1)

The NOT. Z0 shown in the above logical operation represents the inversion of Z0. For example, when Z0=1, NOT.Z0=0. The logical operation here shown calculates values from the left-hand side step by step. Also, the logical operation calculates parenthetical expression first, again from the left-hand side step by step. The first line of the program shows the logical operations of the AND gates AND10 and AND12, the OR gate OR10, the AND gate AND18 and the OR gate OR14, and the second line of the program shows the logical operations of the AND gates AND14 and AND16, the OR gate OR12, the AND gate AND20 and the OR gate OR14. The data selection circuits 73a and 87a are programmable logic circuits. Therefore memory device testing apparatus can test various kinds of memory devices by modifying the logical operation described above.

While it was difficult for the conventional memory device testing apparatus to generate patterns, the memory device testing apparatus of the present invention can easily generate test patterns, by using the pin data selector shown in the embodiments. The pin data selector of the present invention can multiplex data signals and select a plurality of input signals easily. The memory device testing apparatus of the present invention can test various memory devices since the contents of the register selection signal generator 104 and the data selection signal generator 106 are programmable.

Although the present invention has been described by reference to specific embodiments, the scope of the present invention is not limited to these embodiments. Those skilled in the art can make various modifications and improvements to these embodiments of the present invention. It is clear from the appended claims that such modifications or improvements are also covered by the scope of the present invention.

What is claimed is:

1. A memory device testing apparatus for testing a packet system memory device, comprising:

a pattern generator that generates a selection signal and a pattern signal, said pattern signal comprising a plurality of signal components, said selection signal selecting a signal component and expectation value data;

a pin data selector that comprises a plurality of selection elements each corresponding to said signal components of said pattern signal respectively, said pin data selector outputting said signal component selected by said selection signal and generating expectation value data selected by said selection signal;

a memory device socket which holds said memory device, writes test data into said memory device, and reads said test data from said memory device according to said signal component outputted from said pin data selector; and a comparator that compares said expectation value data generated by said pin data selector with said test data read out from said memory device.

2. A memory device testing apparatus of claim 1, wherein said pin data selector outputs said signal component corresponding to a packet signal.

3. A memory device testing apparatus as claimed in claim 2, wherein said pin data selector has a sub pin data selector, which selects an output signal, which constitutes said packet signal, from said base signals in said each cycles and outputs said selected output signal in said each cycles; and a number of said sub pin data selector being larger than a number of signal input pins of said memory device.

4. A memory device testing apparatus as claimed in claim 3, wherein each of said sub pin data selector has a first multiplexer that selects said output signal from said base signals.

5. A memory device testing apparatus as claimed in claim 3 or 4, wherein each of said sub pin data selectors has a plurality of registers, which contains a selection data that indicates which said output signal is to be selected from said base signals; and each of said sub pin data selectors selects said output signal according to said selection data.

6. A memory device testing apparatus as claimed in claim 5, wherein each of said sub pin data selectors has a second multiplexer that selects a register from said plurality of registers to output said selection data contained in said selected register; and said first multiplexer selects said output signal according to said selection data output from said second multiplexer.

7. A memory device testing apparatus as claimed in claim 6 further comprising:

a register selection signal generator which generates a register selection signal to indicate which of a register is to be selected; and said second multiplexer selects said register according to said register selection signal.

8. A memory device testing apparatus as claimed in claim 7, wherein said pattern generator has said register selection signal generator.

9. A memory device testing apparatus as claimed in claim 7, wherein contents of said plurality of registers and said register selection signal are programmable according to a type of said memory device.

10. A memory device testing apparatus as claimed in claim 3 further comprising:

a data selection signal generator which generates a data selection signal that indicates which output signal is to be selected from said base signals;

wherein each of said sub pin data selectors has a logic circuit, which inputs some of said base signals and selects said output signal from input base signals in each of said plurality of cycles and output said output signal in each of said plurality of cycles according to said data selection signal.

11. A memory device testing apparatus as claimed in claim 10 wherein said pin data selector has a selector signal selection circuit, which provides each of said output signal output from each of said sub pin data selector to said memory device socket.

12. A memory device testing apparatus as claimed in claim 10 wherein said logic circuit is a programmable logic circuit, and contents of said logic circuit and said data selection signal are programmable according to a type of said memory device.

13. A memory device testing apparatus as claimed in claim 1 further comprising:

a waveform shaper that shapes a waveform of said packet signal output from said pin data selector into a type of waveform required by said memory device.

14. A memory device testing apparatus of claim 1, wherein said pin data selector outputs said signal component corresponding to data signal applied to said memory device.

15. A memory device testing apparatus as claimed in claims 14, wherein said pin data selector has a sub pin data selector which selects said test data and said expectation value data from said data signals and outputs said test data and said expectation value data a plurality of times; and a number of said sub pin data selector being larger than a number of signal input pins of said memory device; and each of said sub pin data selectors has a test data selection circuit which selects said test data from said data signals.

16. A memory device testing apparatus as claimed in claim 15, wherein said test data selection circuit has a first multiplexer that selects said test data from said data signals.

17. A memory device testing apparatus as claimed in claim 15 or 16, wherein said test data selection circuit has a plurality of registers, which contains a selection data that indicates which said test data is to be selected from said data signals; and said test data selection circuit selects said test data according to said selection data contained in said plurality of registers.

18. A memory device testing apparatus as claimed in claim 17, wherein said test data selection circuit has a second multiplexer that selects a register from said plurality of registers to output said selection data contained in said selected register; and said first multiplexer selects said test data according to said selection data output from said second multiplexer.

19. A memory device testing apparatus as claimed in claim 18 further comprising:

a register selection signal generator which generates a register selection signal to indicate which of said register is to be selected; and said second multiplexer selects said register according to said register selection signal.

20. A memory device testing apparatus as claimed in claim 19, wherein said pattern generator has said register selection signal generator.

21. A memory device testing apparatus as claimed in claim 19, wherein contents of said plurality of registers and said register selection signal are programmable according to a type of said memory device.

22. A memory device testing apparatus as claimed in claim 15 further comprising:

a data selection signal generator which generates a data selection signal that indicates which said test data is to be selected from said data signals generated by said pattern generator;

wherein each of said test data selection circuits has a logic circuit, which inputs some of said data signals generated by said pattern generator and selects said test data from said input data signals and outputs said test data according to said data selection signal.

23. A memory device testing apparatus as claimed in claim 22 wherein said pin data selector has a selector signal selection circuit, which provides each of said test data output from each of said test data selection circuit to said memory device socket.

24. A memory device testing apparatus as claimed in claim 22 wherein said logic circuit is a programmable logic circuit, and contents of said logic circuit and said data selection signal are programmable according to a type of said memory device.

25. A memory device testing apparatus as claimed in claim 14 further comprising:
   a waveform shaper that shapes a waveform of said test data generated by said pin data selector into a type of waveform required by said memory device.

26. A memory device testing apparatus as claimed in claim 15 wherein each of said sub pin data selectors further has an expectation value data selection circuit to select said expectation value data from said data signals and output said expectation value data to said comparator.

27. A memory device testing apparatus as claimed in claim 26, wherein said expectation value data selection circuit has a first multiplexer that selects said expectation value data from said data signals.

28. A memory device testing apparatus as claimed in claim 26 or claim 27, wherein said expectation value data selection circuit has a plurality of registers, which contains a selection data that indicates which said expectation value data is to be selected from said data signals; and
   said expectation value data selection circuit selects said expectation value data according to said selection data contained in said plurality of registers.

29. A memory device testing apparatus as claimed in claim 28, wherein each of said expectation value data selection circuits has a second multiplexer that selects a register from said plurality of registers to output said selection data contained in said selected register; and
   said first multiplexer selects said expectation value data according to said selection data output from said second multiplexer.

30. A memory device testing apparatus as claimed in claim 29 further comprising:
   a register selection signal generator which generates a register selection signal to indicate which of said register is to be selected; and
   said second multiplexer selects said register according to said register selection signal.

31. A memory device testing apparatus as claimed in claim 30, wherein said pattern generator has said register selection signal generator.

32. A memory device testing apparatus as claimed in claim 30, wherein contents of said plurality of registers and said register selection signal are programmable according to a type of said memory device.

33. A memory device testing apparatus as claimed in claim 26 further comprising:
   a data selection signal generator which generates a data selection signal that indicates which said expectation value data is to be selected from said data signals generated by said pattern generator;
   wherein each of said expectation value data selection circuits has a logic circuit, which inputs some of said data signals generated by said pattern generator and selects said expectation value data from said data signals and outputs said expectation value data to said comparator according to said data selection signal.

34. A memory device testing apparatus as claimed in claim 33 wherein said pin data selector has a selector signal selection circuit, which provides each of said expectation value data output from each of said expectation value data selection circuit to said memory device socket.

35. A memory device testing apparatus as claimed in claim 33 wherein said logic circuit is a programmable logic circuit; and contents of said logic circuit and said data selection signal are programmable according to a type of said memory device.

* * * * *